United States Patent [19]

Suppelsa et al.

[11] Patent Number: 5,536,917
[45] Date of Patent: Jul. 16, 1996

[54] HOUSING WITH INTEGRAL THIN FILM RESISTIVE SNAP-FITS

[75] Inventors: Anthony B. Suppelsa; Dale W. Dorinski, both of Coral Springs, Fla.

[73] Assignee: Motorla, Inc., Schaumburg, Ill.

[21] Appl. No.: 264,551

[22] Filed: Jun. 23, 1994

[51] Int. Cl.⁶ .................................................. H05B 1/00
[52] U.S. Cl. ........................ 219/201; 220/201; 156/344
[58] Field of Search ...................... 219/200, 201; 220/201, 306, 307; 16/48.5; 411/171, 180, 904, 909; 24/114.6, 448, 598.1, 602; 156/344

[56] References Cited

U.S. PATENT DOCUMENTS

| | | | |
|---|---|---|---|
| 1,599,107 | 3/1924 | Whitson | 220/201 |
| 2,329,442 | 5/1941 | Popp | 200/168 |
| 2,465,722 | 3/1949 | Hamilton | 219/234 |
| 3,543,000 | 5/1978 | Soller | 219/234 |
| 3,544,762 | 12/1970 | Eisler | 219/200 |
| 4,126,758 | 11/1978 | Krumme | 220/201 |
| 4,540,873 | 9/1985 | Kester | 219/200 |
| 5,025,128 | 6/1991 | Derbyshire | 219/200 |
| 5,025,335 | 6/1991 | Stefansky | 360/97.01 |
| 5,120,175 | 9/1992 | Arbegast et al. | 411/909 |
| 5,134,248 | 7/1992 | Kiec et al. | 174/84 R |
| 5,273,383 | 12/1993 | Hughes | 411/180 |
| 5,339,296 | 8/1994 | Davis | 368/67 |
| 5,380,221 | 1/1995 | Grabbe | 411/909 |

FOREIGN PATENT DOCUMENTS

| | | | |
|---|---|---|---|
| 3921747A1 | 1/1991 | Germany | 220/201 |
| 6604120 | 9/1966 | Netherlands | 219/200 |
| 1011680 | 12/1965 | United Kingdom | 219/200 |

OTHER PUBLICATIONS

U.S. Postal System Express Mail envelope "opening fastener" No. 102595-93-B-0453 (EP-13A-Aug. 1993).

Primary Examiner—Teresa J. Walberg
Assistant Examiner—Karl Easthom
Attorney, Agent, or Firm—Dale W. Dorinski

[57] ABSTRACT

An assembly (5) has two or more plastic parts joined together. One of the plastic parts (20) has an electrical heating element (31) whose function is to soften a portion of the plastic when the heating element is electrically energized. Once the plastic is softened, the two parts can be separated and the assembly disassembled. When the two parts are joined together with snap-fit joints, the snap-fits have a heating element to soften a portion of the snap-fit (24) when the heating element is electrically energized, thereby allowing the housing to be opened and separated. If the two parts are ultrasonically welded together to form a housing, a heating element is located therein to soften the ultrasonically welded portion (44), thereby allowing the two halves of the housing to be separated. The heating element can be a nichrome or thin film resistor that is energized by a source (33) located within the housing, or by an power source external to the housing, or it may be inductively coupled to the power source.

1 Claim, 3 Drawing Sheets

5,536,917

HOUSING WITH INTEGRAL THIN FILM RESISTIVE SNAP-FITS

TECHNICAL FIELD

This invention relates in general to mechanical fastening means, and more particularly to fastening means that are used in plastic assemblies that can be easily disassembled.

BACKGROUND

The impact of manufacturing an obsolete product on the environment has become a significant issue. The materials used in the manufacture of most electronics products consume non-renewable resources such as oil, gas, and metals. At the same time, regulations are restricting exposure to materials used during manufacture because of adverse health effects and the cost associated with waste disposal is increasing. Many municipalities have imposed voluntary recycling programs for plastics that have demonstrated that recycling can have a positive effect on the environment by minimizing the waste and eliminating potentially toxic material in landfills.

Many countries are enacting legislation which requires the manufacturers of electronics equipment to take back and dispose of used products. Similar legislation for battery cells, including non-rechargeable alkaline cells and rechargeable nickel-cadmium cells, is in effect or is being considered in the United States, and manufacturers are now responsible for the final disposition of their products after the useful life. It is not a great stretch of the imagination to assume that companies will one day become responsible for the post consumer disposition of all products.

There are many reasons for recovering used products, such as regulatory, environmental impact, image in the marketplace, acting as a responsible corporate citizen, or simply recovering expensive raw materials. Present technology is heavily weighted to designing the product for ease of manufacturing. This philosophy, known as design for manufacturing (DFM) focuses on ways to make the product easier to assemble, thus making it lower cost. However, this approach often results in a product that is difficult or impossible to recycle, because the product cannot be easily disassembled. Fastening schemes such as ultrasonic welding and snap-fit joints are easy to assemble in the manufacturing facility, and make a rugged, reliable package. The very ruggedness of these fastening schemes also make them impervious to disassembly. For example, ultrasonically welded packages must be sawed in half or otherwise cracked or destroyed in order to open them. Snap-fit joints, the salvation of DFM, are considered to be 'one-way' joints, because they are difficult, it not impossible, to open once actuated. In the prior art, snap-fit joints are typically designed to be unseparable, with the force required to separate the two components being a function of the design. When viewed from this new perspective of recovery and recycling, these existing joining methods are not desirable, because they require expensive labor to open the packages. Clearly, a need exists for an improved package design that can be easily and inexpensively disassembled.

SUMMARY OF THE INVENTION

Briefly, according to the invention, there is provided an assembly composed of two plastic parts joined together. One of the plastic parts has an electrical heating element whose function is to soften a portion of the plastic when the heating element is electrically energized. Once the plastic is softened, the two parts can be separated and the assembly disassembled.

In one embodiment, the two parts are joined together with snap-fit joints to form a housing. The snap-fits have a heating element to soften a portion of the snap-fit when the heating element is electrically energized, thereby allowing the housing to be opened and separated.

In another embodiment, the two parts are ultrasonically welded together to form a housing. The housing has a heating element located therein to soften the ultrasonically welded portion of the housing when the heating element is electrically energized, thereby allowing the two halves of the housing to be separated.

In still other embodiments, the heating element is a NICHROME resistor that is energized by a source located within the housing, or by a power source external to the housing, and the resistor may be inductively coupled to the power source.

DETAILED DESCRIPTION OF THE PREFERRED EMBODIMENT

Figure 1:
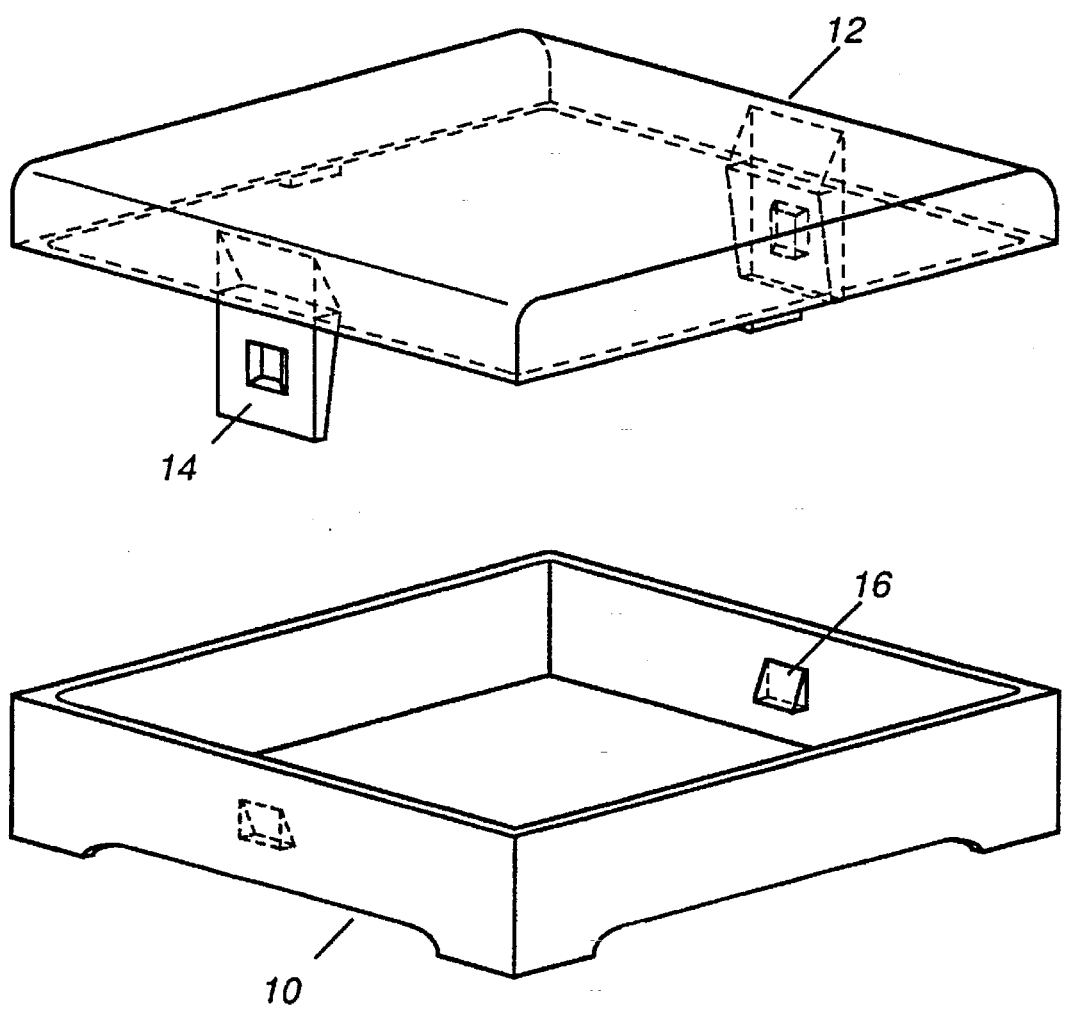
FIG. 1 is an exploded isometric view of two housing halves, each having a portion of a snap fit joint.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a plastic assembly 5 typically consists of at least two parts or components. A first part 10 is made separately from a second part 12. The two parts are typically joined together to form an assembly. In some cases the physical coupling of the two parts 10, 12 forms a subassembly that is a component of larger assemblies, and in other cases the coupling of the two parts creates a housing. In order to keep the assembly from separating, some means of mechanical fastening is typically employed. Examples of some commonly used fastening means are screws, rivets, snap-fit joints, adhesives, and ultrasonic welding. In all types of fasteners, a certain structure is created in the plastic parts in order to accommodate the threads of the fastening means (the screw or the snap-fit joint). This structure can be created in either of the parts or halves. Snap-fit joints are well known to those skilled in the art, and are a simple, economical, rapid way of joining two different components. There are many types of snap-fit joints, and each has in common the principle that a protruding part 14, e.g., a hook, stud or bead, in one component 12 is temporarily deflected, to catch in a depression or undercut 16 in the mating component 10. After the joining operation, the snap-fit joint typically returns to a stress-free condition. Once the two halves 10, 12 of the housing shown in FIG. 1 are joined together, it is difficult, it not impossible, to separate them without damage, as no means of accessing the snap-fit joints to release them from the outside is provided. Several types of snap joints are commonly used; cantilever snap joints, torsion snap joints and annular snap joints.

Figure 2:
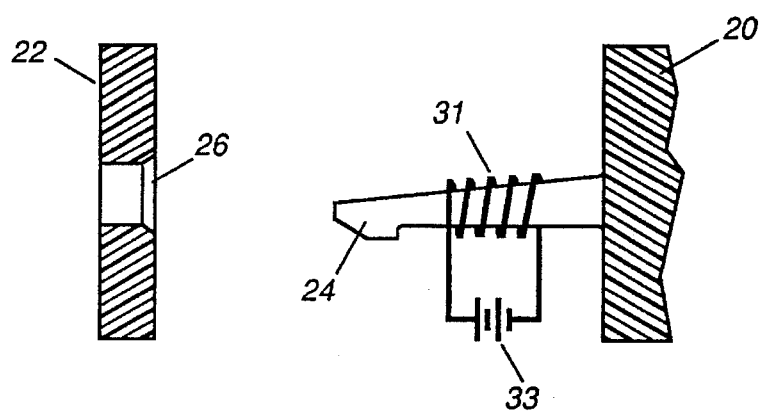
FIG. 2 is a cross-sectional view of a snap fit having a heating element and a power source in accordance with the invention.

Referring now to FIG. 2, a first housing portion 20 has formed thereon a first snap fit 24. A second housing portion 22 has a corresponding second snap fit 26 that is formed so as to mate with the first snap fit 24. The first snap fit 24 has a heating element 31 formed on at least a portion of the snap fit. The heating element 31 is connected to a source of electrical energy or electrical power 33. In many applications such as portable radios or other portable consumer electronic products, the power source 33 will be a battery. However, it can be an external source, such as a regulated power supply. The power source 33 may, alternatively, be located external to the housing, that is, in a separate housing or power supply. If this is the case, it may be connected to the heating element 31 by conventional mechanical coupling, or it may also be inductively coupled to the heating element 31 in order to energize and heat the element. The power supply 33 serves to energize the heating element 31 so as to cause a portion of the snap fit 24 to heat and thereby soften. This occurs because snap fit joints used in the preferred embodiment are made from a thermoplastic material that can be easily softened by heating. The softening temperature will vary depending upon the type of thermoplastic material used.

When the housing member 20 is joined to housing member 22 to form an assembly, snap fit 24 engages with snap fit 26 by deflecting and catching in the opening. In order to disassemble the now joined housing halves 20 and 22 from each other, the heating element 31 is energized by the power source 33. This heats and softens a portion of snap fit 24, thereby allowing the snap fit to be deformed and withdrawn from the corresponding snap fit 26. Various configurations of snap fits and heating elements may be employed, and depending upon how these configurations are arranged, other portions of snap fit 24 may also be heated to the extent that it is softened and melts, thereby allowing housing half 20 to be separated from housing half 22 by actually breaking the beaded portion of snap fit 24. The reader will appreciate that as a portion of snap fit 24 is softened and melted, it can be easily stretched or broken by minimal force applied between housings 20 and 22.

The actual arrangement or configuration of the heating element 31 can take a number of forms. For example, the heating element may be a NICHROME wire that is wrapped in a spiral fashion around the snap fit 24. Another embodiment finds a thick or thin film resistor placed directly on the surface of the snap fit 24, and electrically coupled to the power source 33. Thick film resistors or thin film resistors are well known in the art and their various means of application are also well known.

Figure 3:
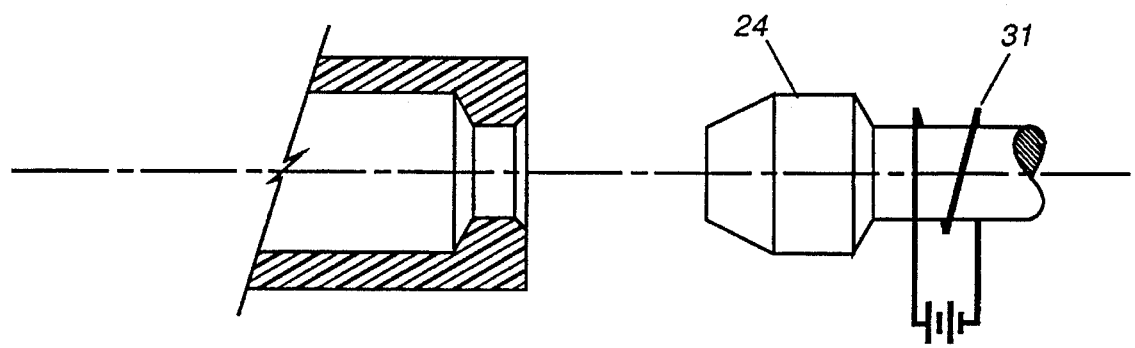
FIGS. 3 and 4 are cross-sectional views of other embodiments of snap fits having a heating element and power supply in accordance with the invention.
Figure 4:
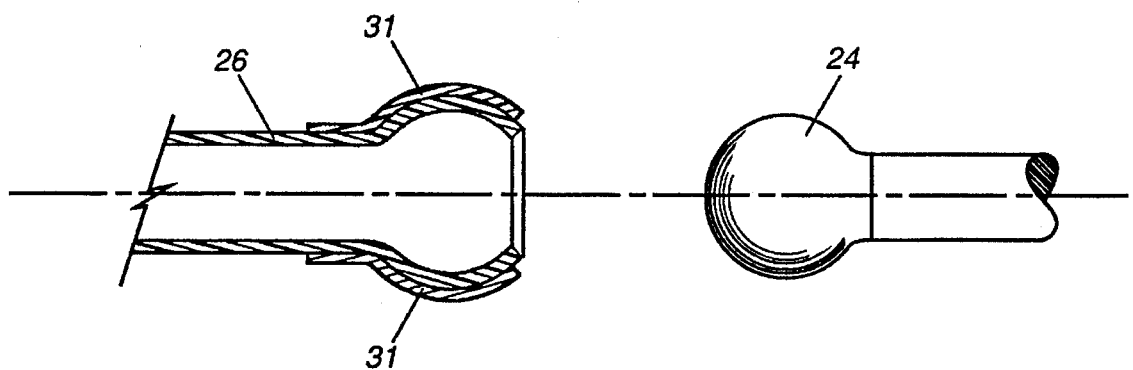

Alternate configurations of the snap fits and heating elements may be seen in FIGS. 3 and 4, where a ball and sleeve configuration is used. In FIG. 3 the heating element 31 is wrapped around the throat or stud of the snap fit 24 so as to soften that portion of the snap fit. In FIG. 4 the heating element 31 is shown as a thick- or thin-film resistor applied to the exterior of the second snap fit 26 which is the portion that receives the first snap fit 24. In this manner the second snap fit 26 is easily softened and deformed, allowing snap fit 24 to be withdrawn and the two housing halves to be thereby separated. One embodiment of the invention uses screws or other types of threaded or riveted fasteners in place of snap fits. In this case, the area where the threaded fastener or screw is connected to the housing would carry the resistive element. When the resistive element is heated and actuated, it softens the area directly underneath it and allows the screw to be withdrawn without having to unscrew it.

Figure 5:
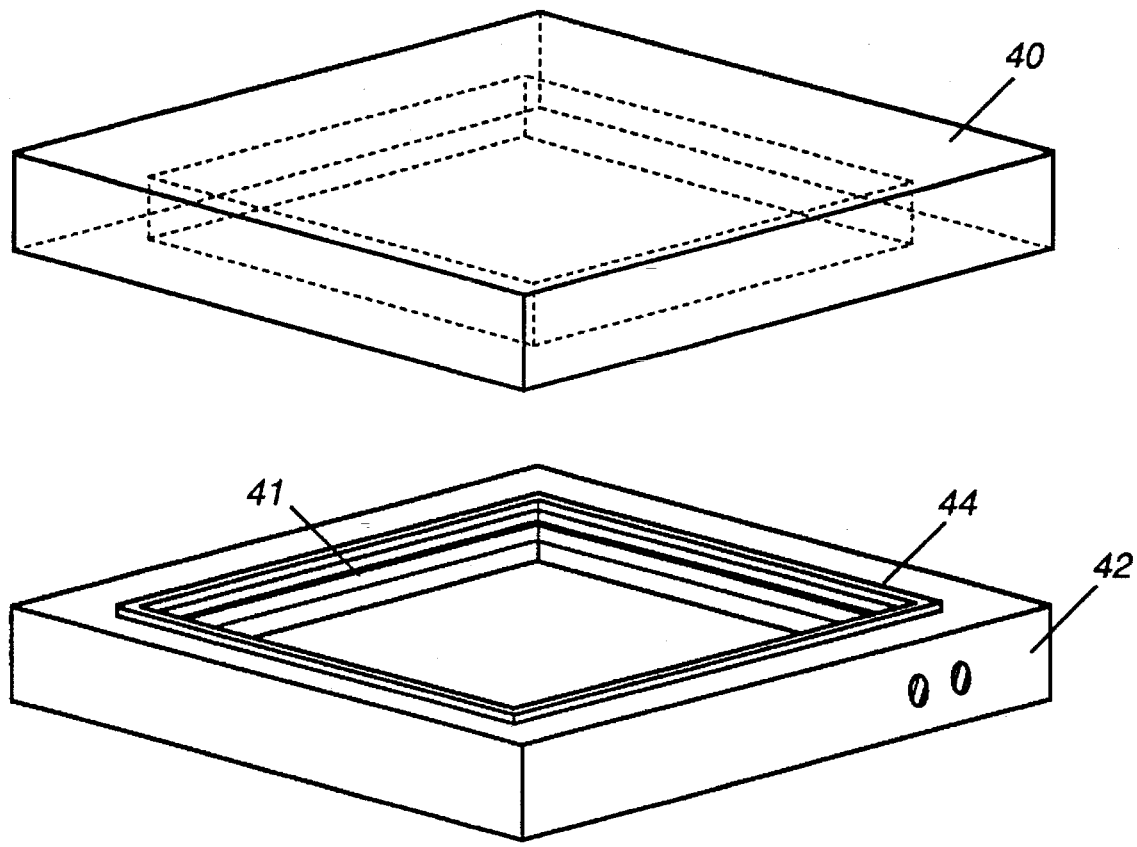
FIG. 5 is an exploded isometric view of an ultrasonically welded housing having a heating element in accordance with the invention.

FIG. 5 shows an exploding view of two housing halves prior to joining by ultrasonic welding. In this embodiment of the invention, the two housing halves 40 and 42 are joined, for example, by a method of ultrasonically welding them. Ultrasonic welding is another well-known method of joining thermoplastic materials together. In this instance, an area 44 of the housing 42 is formed to be an ultrasonic weld to housing 40, creating a one-piece housing as shown. A heating element 41 is arranged on the interior of one or both of the housing halves. In this case, the heating element 41 is electrically energized in order to heat and soften a portion of the housing 42 so as to cause the ultrasonic weld 44 or adjacent area to be softened, thereby allowing housing half 40 to be separated from housing half 42. It should be clear to the reader that a number of configurations for arranging the heating element may be employed. For example, the heating element may be a resistive wire, such as NICHROME, that is embedded in one of the housing halves directly in an area adjacent to the ultrasonic weld, it may be a thick- or thin-film resistor placed on the surface near the ultrasonic weld, or the resistor may be placed on a surface somewhat farther away, as long as it serves to heat and soften the plastic. By heating and softening, the plastic will melt or deform, thereby allowing the ultrasonic weld to be broken and the two housing halves to be easily separated.

Figure 6:
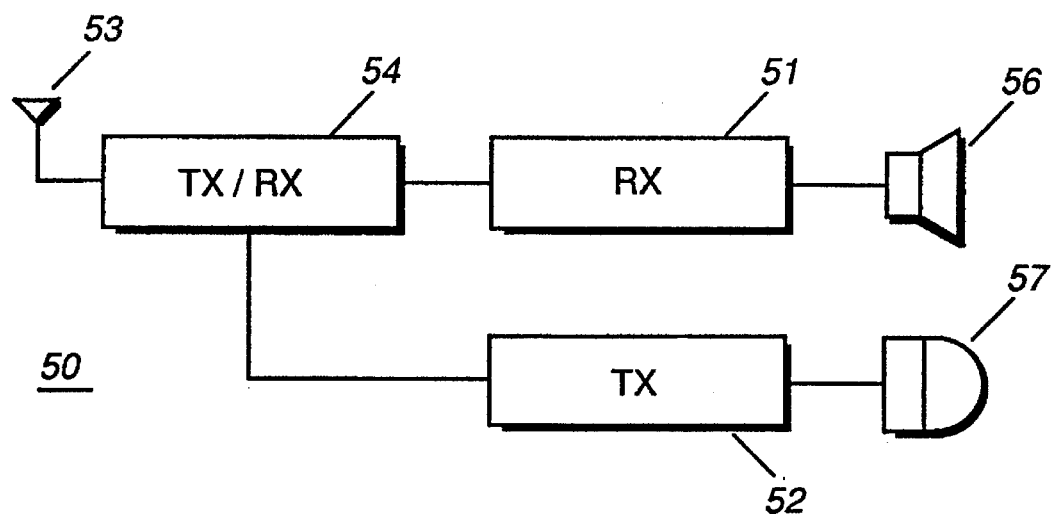
FIG. 6 is a block diagram of a radio in accordance with the invention.

In addition, another embodiment would find the use of the instant invention to create a housing for a portable radio or other communication device. The housing has the fastening means (snap fit, ultrasonic weld, screw, adhesive joint, rivet, etc.) as described in the instant invention, having the heating element located on one portion of the fastening means, the heating element being electrically energized at an appropriate time in order to soften or deform the fastening means. Also located within the housing is a radio having a transmitter. Referring to FIG. 6, a radio 50 comprises any well-known radio, such as portable two-way radios manufactured by Motorola Inc., which may operate in either receive or transmit modes. The radio 50 includes a receiver section 51 and a transmitter section 52 which comprise means for communicating, that is, transmitting or receiving communication signals for the radio. In the receive mode, the portable radio 50 receives a communication signal via an antenna 53. A transmit/receive (T/R) switch 54 couples the received communication signal to the receiver 51. The receiver 51 receives and demodulates the received communications signal and presents its audio component to a speaker 56. It may be appreciated by one of ordinary skill in the art that other functions not herein described may be provided by any suitable means, including a controller means (not shown), which controls the entire operation of the radio 50. In the transmit mode, audio messages are coupled from a microphone 57, where they are used to modulate a carrier signal as is well known in the art. The modulated carrier signal is then applied to the antenna 53 through the T/R switch 54 for transmission of the communication signal. It may be appreciated that suitable portions of the transmitter or receiver sections 52, 55, or the entire radio 50 may be incorporated into the plastic housing of the present invention.

It can be seen that the use of this invention allows one to easily and rapidly separate plastic assemblies that may have been joined by snap fits, ultrasonic welds, screws, adhesives, or other types of fasteners. By providing an easy and rapid means of separating plastic assemblies that have been joined by these fastening methods, portable electronic assemblies, such as radios, may be created that can be easily disassembled to recover and recycle the components of both the housings and internal parts. While these embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A two piece thermoplastic housing, comprising;

a first housing portion having a protruding part of a thermoplastic snap fit;

a second housing portion having a corresponding mating part of a thermoplastic snap fit;

the protruding part coupled with the mating part to join the first and second housing portions together, forming the two piece thermoplastic housing;

at least one of the snap-fit parts having an integral heating element comprising a thin film resistor to heat and soften a portion of the snap-fit when the heating element is electrically energized, thereby softening the snap fit so that the protruding part uncouples from the mating part, allowing the two housing portions to be separated.

* * * * *